US012765169B2

(12) United States Patent
Kim et al.

(10) Patent No.: US 12,765,169 B2
(45) Date of Patent: Oct. 13, 2026

(54) ELECTROLUMINESCENT DISPLAY DEVICE

(71) Applicant: LG DISPLAY CO., LTD., Seoul (KR)

(72) Inventors: Yong-Il Kim, Chungcheongnam-do (KR); Byungjin Kim, Paju-si (KR); Jinkwon Park, Seoul (KR); Wooseok Jeong, Incheon (KR)

(73) Assignee: LG Display Co., Ltd. (KR)

(*) Notice: Subject to any disclaimer, the term of this patent is extended or adjusted under 35 U.S.C. 154(b) by 942 days.

(21) Appl. No.: 17/866,937

(22) Filed: Jul. 18, 2022

(65) Prior Publication Data

US 2023/0075253 A1 Mar. 9, 2023

(30) Foreign Application Priority Data

Sep. 3, 2021 (KR) ........................ 10-2021-0117569
Dec. 16, 2021 (KR) ........................ 10-2021-0180509

(51) Int. Cl.
*H10K 50/86* (2023.01)
*H10K 59/122* (2023.01)
*H10K 59/131* (2023.01)

(52) U.S. Cl.
CPC ......... *H10K 50/865* (2023.02); *H10K 59/122* (2023.02); *H10K 59/131* (2023.02)

(58) Field of Classification Search
CPC .. H10K 50/865; H10K 59/122; H10K 59/131; H10D 86/423
See application file for complete search history.

(56) References Cited

U.S. PATENT DOCUMENTS

2014/0353660 A1 12/2014 Jung et al.
2019/0189721 A1* 6/2019 Kim .................. G02F 1/136227
2020/0144309 A1 5/2020 Jeon et al.
(Continued)

FOREIGN PATENT DOCUMENTS

CN 104183601 A 12/2014
CN 110010623 A 7/2019
(Continued)

OTHER PUBLICATIONS

Office Action in Korean Appln. No. 20210180509, mailed on Jan. 14, 2025, 12 pages (with English translation).

*Primary Examiner* — Thomas K Pham
(74) *Attorney, Agent, or Firm* — Fish & Richardson P.C.

(57) ABSTRACT

An electroluminescent display device includes a substrate divided into a display area and a non-display area, a first light-blocking layer and a data line disposed on the substrate in the display area, a first buffer layer disposed on the first light-blocking layer and the data line, a semiconductor layer disposed on an upper portion of the first buffer layer and made of an oxide semiconductor, a gate insulating layer disposed on the semiconductor layer, a gate electrode disposed on the gate insulating layer, a protective layer and a first planarization layer disposed on an upper portion of the gate electrode, a drain electrode disposed on the protective layer exposed by removing a partial area of the first planarization layer, a second planarization layer disposed on the drain electrode and the first planarization layer, and a light-emitting element disposed on an upper portion of the second planarization layer and including an anode, a light-emitting part, and a cathode.

11 Claims, 7 Drawing Sheets

(56) References Cited

U.S. PATENT DOCUMENTS

| | | | | |
|---|---|---|---|---|
| 2021/0020872 | A1* | 1/2021 | Park | H10D 86/451 |
| 2021/0181554 | A1* | 6/2021 | Hong | H10K 59/131 |
| 2021/0202653 | A1* | 7/2021 | Cho | H10K 71/00 |
| 2021/0225989 | A1* | 7/2021 | Ryu | H10K 50/865 |

FOREIGN PATENT DOCUMENTS

| | | | |
|---|---|---|---|
| CN | 112242428 | A | 1/2021 |
| CN | 112992920 | A | 6/2021 |
| CN | 113130548 | A | 7/2021 |
| DE | 102019129838 | A1 | 5/2020 |
| KR | 10-2016-0049178 | A | 5/2016 |
| KR | 20170113794 | A | 10/2017 |
| KR | 10-2021-0006628 | A | 1/2021 |
| KR | 20210072953 | A | 6/2021 |
| KR | 20210086898 | A | 7/2021 |

* cited by examiner

ELECTROLUMINESCENT DISPLAY DEVICE

CROSS-REFERENCE TO RELATED APPLICATIONS

This application claims the priority of Korean Patent Applications No. 10-2021-0117569 filed on Sep. 3, 2021 and No. 10-2021-0180509 filed on Dec. 16, 2021, which are hereby incorporated by reference in their entirety.

BACKGROUND

Field of the Disclosure

The present disclosure relates to an electroluminescent display device, and more particularly, to an electroluminescent display device using an oxide thin-film transistor.

Description of the Background

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

As the representative display devices, there are a liquid crystal display device (LCD), an electrowetting display device (EWD), an organic light-emitting display device (OLED), and the like.

Among the display devices, an electroluminescent display device including the organic light-emitting display device refers to a display device that autonomously emits light. Unlike a liquid crystal display device, the electroluminescent display device does not require a separate light source and thus may be manufactured as a lightweight, thin display device. In addition, the electroluminescent display device is advantageous in terms of power consumption because the electroluminescent display device operates at a low voltage. Further, the electroluminescent display device is expected to be adopted in various fields because the electroluminescent display device is also excellent in implementation of colors, response speeds, viewing angles, and contrast ratios (CRs).

The electroluminescent display device is configured such that a light-emitting layer made of an organic material is disposed between two electrodes called an anode and a cathode. Further, when positive holes are injected into the light-emitting layer from the anode and electrons are injected into the light-emitting layer from the cathode, the injected electrons and positive holes are recombined and produce excitons in a light-emitting layer.

SUMMARY

Accordingly, the present disclosure is to provide an electroluminescent display device using an oxide thin-film transistor made by mask processes in the reduced number of masks.

The present disclosure is also to provide an electroluminescent display device using an oxide thin-film transistor having properties improved by blocking hydrogen from a sealing layer or outside.

Further, the present disclosure is to provide an electroluminescent display device using an oxide thin-film transistor, in which a charging rate of a storage capacitor is increased by decreasing a parasitic capacity.

The present disclosure is not limited to the above-mentioned, which are not mentioned above, can be clearly understood by those skilled in the art from the following descriptions.

According to an aspect of the present disclosure, an electroluminescent display device includes a substrate divided into a display area and a non-display area, a first light-blocking layer and a data line disposed on the substrate in the display area, a first buffer layer disposed on the first light-blocking layer and the data line, a semiconductor layer disposed on an upper portion of the first buffer layer and made of an oxide semiconductor, a gate insulating layer disposed on the semiconductor layer, a gate electrode disposed on the gate insulating layer, a protective layer and a first planarization layer disposed on an upper portion of the gate electrode, a drain electrode disposed on the protective layer exposed by removing a partial area of the first planarization layer, a second planarization layer disposed on the drain electrode and the first planarization layer and a light-emitting element disposed on an upper portion of the second planarization layer and including an anode, a light-emitting part, and a cathode.

According to another aspect of the present disclosure, an electroluminescent display device includes a substrate divided into a display area and a non-display area, a first light-blocking layer and a data line disposed on the substrate in the display area, a first buffer layer disposed on the first light-blocking layer and the data line, a semiconductor layer on an upper portion of the first buffer layer and made of an oxide semiconductor, a gate insulating layer disposed on the semiconductor layer, a gate electrode disposed on the gate insulating layer, a first planarization layer disposed on the gate electrode, a drain electrode disposed on the gate insulating layer exposed by removing a partial area of the first planarization layer, a second planarization layer disposed on the drain electrode and the first planarization layer and a light-emitting element disposed on an upper portion of the second planarization layer and including an anode, a light-emitting part, and a cathode.

Other detailed matters of the exemplary aspects are included in the detailed description and the drawings.

According to the present disclosure, the number of mask processes required to manufacture the oxide thin-film transistor may be reduced, thereby improving productivity and reducing the number of processes and material costs.

According to the present disclosure, the drain electrodes, which serve to trap hydrogen, are formed above the oxide thin-film transistors, thereby inhibiting hydrogen from entering the oxide thin-film transistors. Therefore, it is possible to improve properties and reliability of the transistors.

According to the present disclosure, the light-blocking layer contact hole and the drain contact hole are disposed to overlap with each other, and the vertical level difference is formed between the identical types of electrodes, such that the parasitic capacity can be reduced, thereby increasing the charging rate of the storage capacitor.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
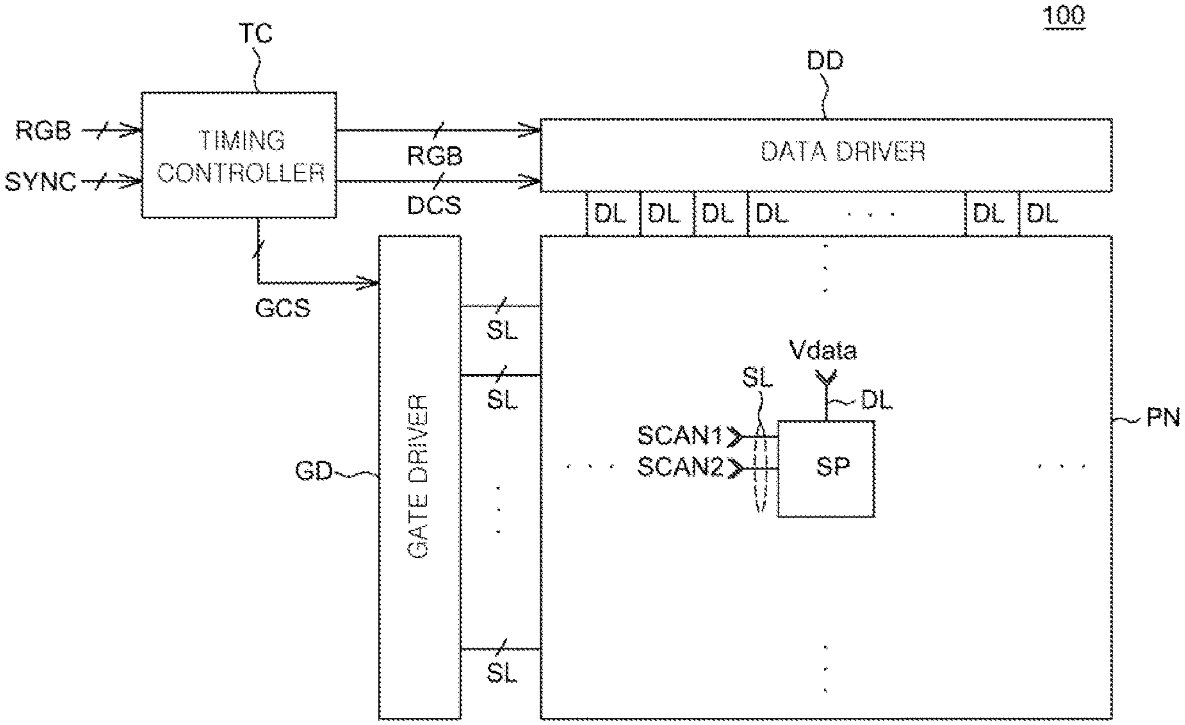
FIG. 1 is a schematic configuration view of an electroluminescent display device according to a first aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various exemplary aspects of the present disclosure will be described in detail with reference to the accompanying drawings.

FIG. 1 is a schematic configuration view of an electroluminescent display device according to a first aspect of the present disclosure.

Referring to FIG. 1, an electroluminescent display device 100 according to a first aspect of the present disclosure may include a display panel PN including a plurality of subpixels SP, a gate driver GD and a data driver DD configured to supply various types of signals to the display panel PN, and a timing controller TC configured to control the gate driver GD and the data driver DD.

The gate driver GD may supply a plurality of scan signals to a plurality of scan lines SL based on a plurality of gate control signals GCS provided from the timing controller TC. The plurality of scan signals may include a first scan signal SCAN1 and a second scan signal SCAN2.

The data driver DD may convert image data RGB, which are inputted from the timing controller TC based on the plurality of data control signals DCS provided from the timing controller TC, into a data signal Vdata using a reference gamma voltage. Further, the data driver DD may supply the converted data signal Vdata to a plurality of data lines DL.

The timing controller TC may align the image data RGB inputted from the outside and supply the aligned image data RGB to the data driver DD. The timing controller TC may create a gate control signal GCS and a data control signal DCS by using a synchronizing signal SYNC inputted from the outside.

Hereinafter, a pixel structure of the electroluminescent display device according to the first aspect of the present disclosure will be described in more detail with reference to FIGS. 2 and 3.

Figure 2:
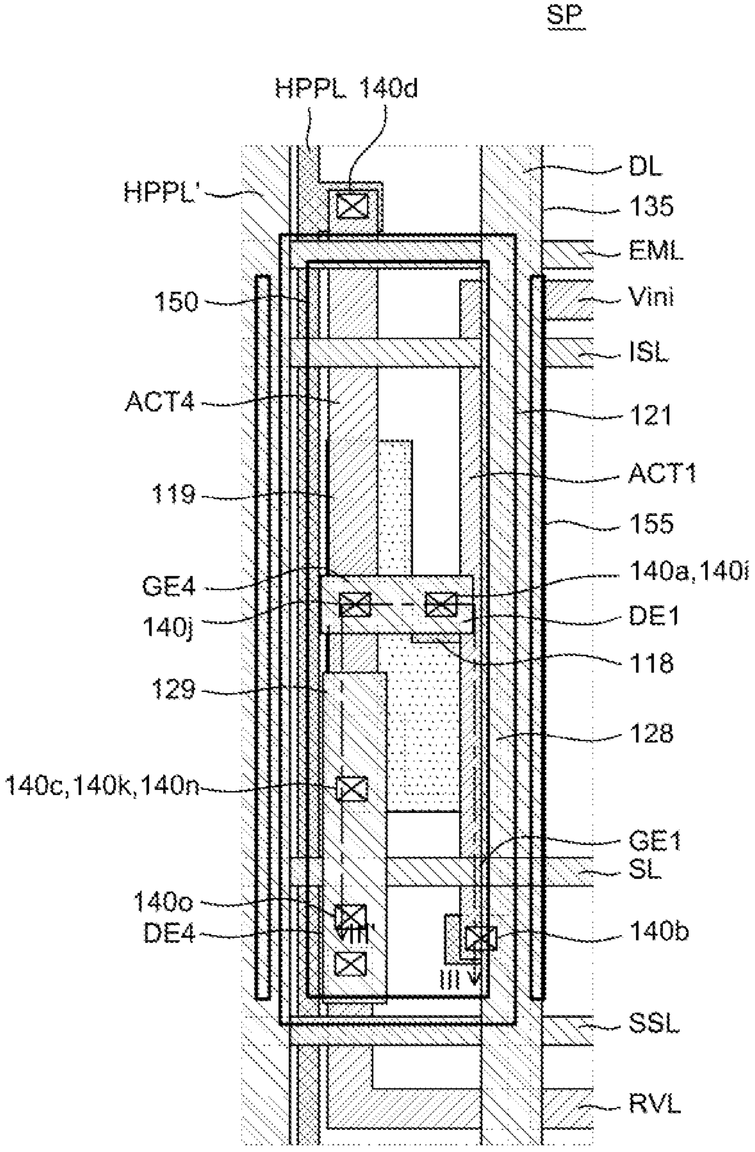
FIG. 2 is a top plan view of the electroluminescent display device in FIG. 1.

FIG. 2 is a top plan view of the electroluminescent display device in FIG. 1.

Figure 3:
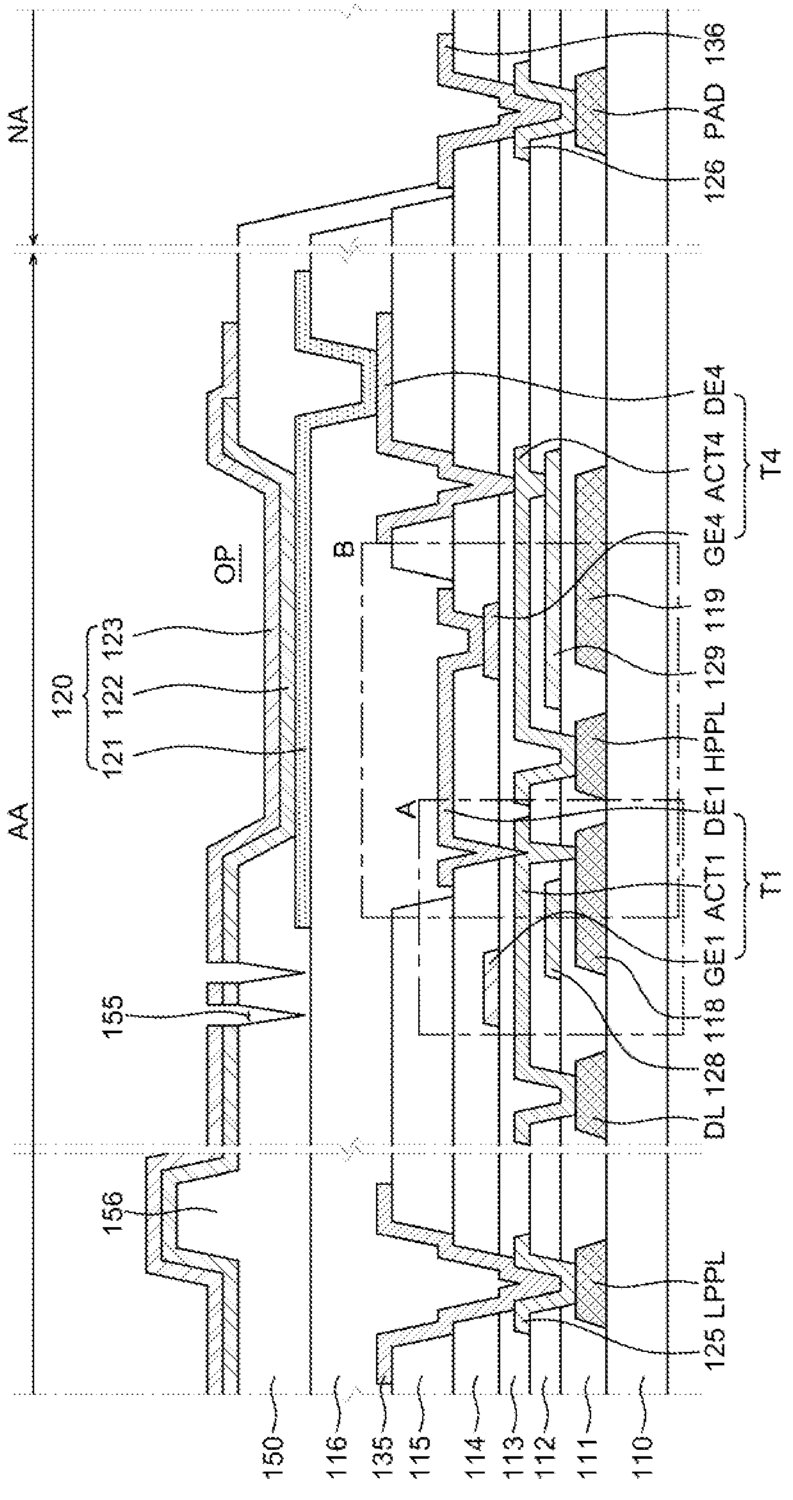
FIG. 3 is a cross-sectional view including a cross-section taken along line III-III' in FIG. 2.

FIG. 3 is a cross-sectional view including a cross-section taken along line III-III' in FIG. 2.

Figure 4:
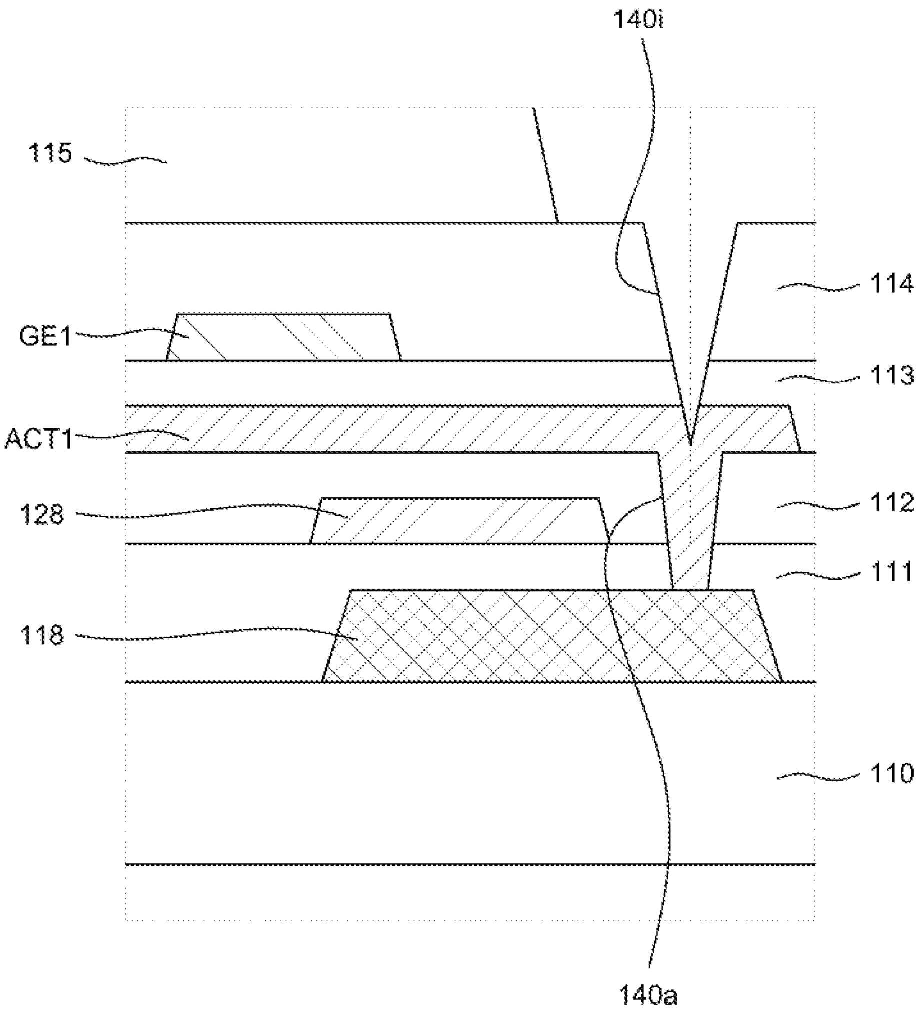
FIG. 4 is an enlarged view of part A in FIG. 3.

FIG. 4 is an enlarged view of part A in FIG. 3.

Figure 5:
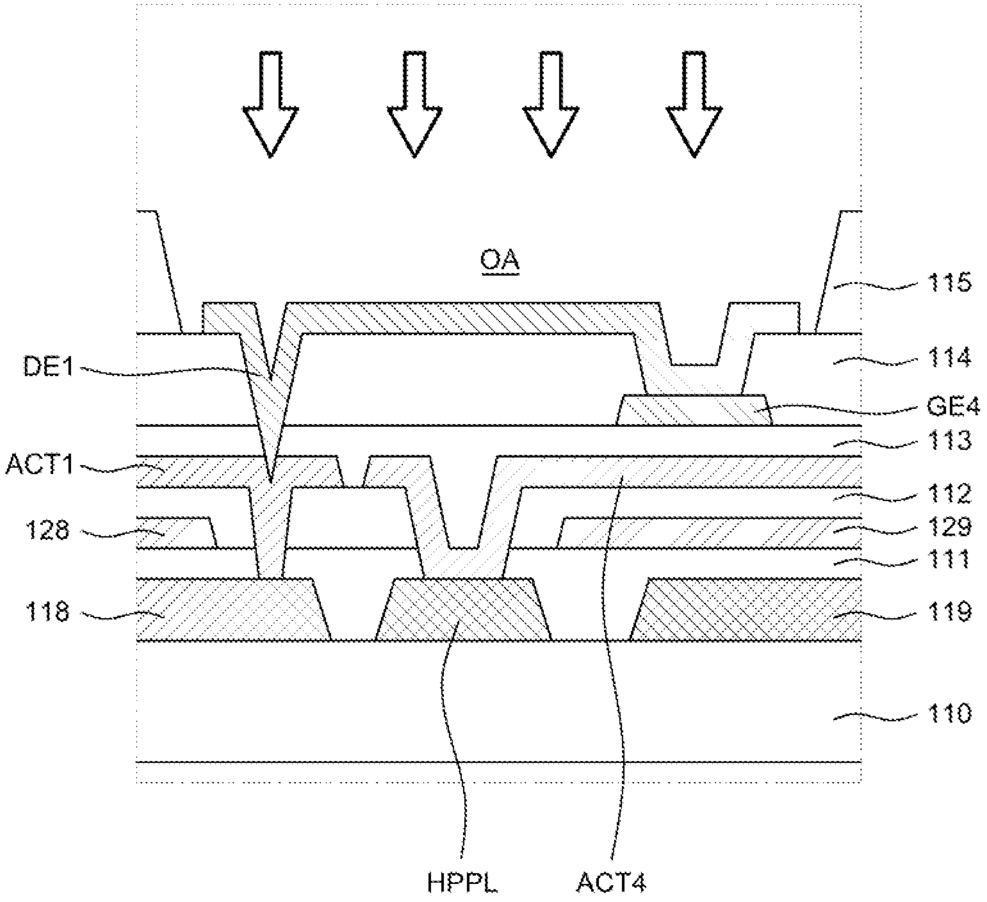
FIG. 5 is an enlarged view of part B in FIG. 3.

FIG. 5 is an enlarged view of part B in FIG. 3.

FIG. 2 illustrates a pixel structure of a single subpixel SP. FIG. 3 illustrates a part of a display area AA and a part of a non-display area NA including a pad part.

For the convenience, FIG. 2 illustrates only an anode 121 of a light-emitting element 120.

First, the electroluminescent display device according to the first aspect of the present disclosure may include a display panel, a flexible film, and a printed circuit board.

The display panel is a panel configured to display images to a user.

The display panel may include a display element configured to display images, a driving element configured to operate the display element, and lines configured to transmit various types of signals to the display element and the driving element. Different display elements may be defined depending on the types of display panels. For example, in a case in which the display panel is an electroluminescent display panel, the display element may be a light-emitting element including an anode, an organic light-emitting layer, and a cathode.

Hereinafter, the assumption is made that the display panel is the electroluminescent display panel. However, the display panel is not limited to the electroluminescent display panel.

Referring to FIGS. 2 and 3, the display panel may include the display area AA and the non-display area NA.

The display area AA is an area of the display panel in which images are displayed.

The display area AA may include a plurality of subpixels SP constituting the plurality of pixels, and a circuit configured to operate the plurality of subpixels SP. The plurality of subpixels SP is minimum units constituting the display area AA. The display element may be disposed in each of the plurality of subpixels SP. The plurality of subpixels SP may constitute the pixel. For example, the plurality of subpixels SP may each include the light-emitting element 120 including the anode 121, a light-emitting part 122, and a cathode 123. However, the present disclosure is not limited thereto. In addition, the circuit configured to operate the plurality of subpixels SP may include driving elements, lines, and the like. For example, the circuit may include, but not limited to, thin-film transistors T1 and T4, a storage capacitor, a scan line SL, a data line DL, and the like.

The plurality of subpixels SP may include a first subpixel, a second subpixel, and a third subpixel that emit light beams with different colors. For example, the first subpixel may be a green subpixel, the second subpixel may be a red subpixel, and the third subpixel may be a blue subpixel. However, the present disclosure is not limited thereto.

The arrangement of the plurality of subpixels SP, the number of subpixels, and the color combination may be variously changed in accordance with design, and the present disclosure is not limited thereto.

The non-display area NA is an area in which no image is displayed.

The display area AA and the non-display area NA may be suitable for the design of an electronic device equipped with the electroluminescent display device.

Various lines and circuits for operating the light-emitting element 120 in the display area AA may be disposed in the non-display area NA. For example, the non-display area NA may include, but not limited to, pad lines PAD or link lines for transmitting signals to the plurality of subpixels SP and the circuit in the display area AA. The non-display area NA may include a drive IC such as a gate driver IC and a data driver IC.

In this case, the gate driver IC may be formed independently of the display panel and electrically connected to the display panel in various ways. However, the gate driver IC may be configured in a gate-in-panel (GIP) manner so as to be mounted in the display panel.

The electroluminescent display device may include various additional elements configured to create various signals or operate the pixels in the display area AA. The additional elements for operating the pixel may include an inverter circuit, a multiplexer, an electrostatic discharge (ESD) circuit, and the like. The electroluminescent display device may also include additional elements related to functions other than the function of operating the pixel. For example, the electroluminescent display device may include additional elements that provide a touch detection function, a user certification function (e.g., fingerprint recognition), a multi-level pressure detection function, a tactile feedback function, and the like. The additional elements may be positioned in the non-display area NA and/or an external circuit connected to a connection interface.

The flexible film is a film for supplying signals to the plurality of subpixels SP and the circuit in the display area AA. The flexible film may be electrically connected to the display panel. The flexible film is disposed at one end of the non-display area NA of the display panel. The flexible film may supply power voltage, data voltage, and the like to the plurality of subpixels SP and the circuit in the display area. For example, the drive IC such as the data driver IC may be disposed on the flexible film.

The printed circuit board may be disposed at one end of the flexible film and connected to the flexible film. The printed circuit board is a component configured to supply signals to the drive IC. The printed circuit board may supply the drive IC with various signals such as driving signals, data signals, and the like.

The pixel structure will be specifically described. A substrate 110 may be divided into the display area AA and the non-display area NA disposed outside the display area AA.

The thin-film transistors T1 and T4, the light-emitting element 120, and a sealing layer (not illustrated) may be disposed on an upper portion of the substrate 110 in the display area AA.

The pad line PAD and the sealing layer may be disposed on the upper portion of the substrate 110 in the non-display area NA.

The substrate 110 serves to support and protect the components of the electroluminescent display device that are disposed on the upper portion of the substrate 110.

Recently, the flexible substrate 110 may be made of a flexible material such as plastic having flexibility.

The flexible substrate 110 may be provided in the form of a film made of one selected from a group consisting of polyester-based polymer, silicon-based polymer, acrylic polymer, polyolefin-based polymer, and a copolymer thereof.

First light-blocking layers 118 and 119 may be disposed on the substrate 110.

The first light-blocking layers 118 and 119 may be disposed below the thin-film transistors T1 and T4 in the display area AA.

The first light-blocking layers 118 and 119 may be made of a metallic material having a light blocking function in order to inhibit outside light from entering semiconductor layers ACT1 and ACT4 of the thin-film transistors T1 and T4.

The first light-blocking layers 118 and 119 may be configured as a single layer. However, for the convenience, the first light-blocking layers 118 and 119 are classified into a right first light-blocking layer 118 and a left first light-blocking layer 119.

The first light-blocking layers 118 and 119 may each be configured as a single layer or multilayer made of any one of opaque metallic materials such as aluminum (Al), chromium (Cr), tungsten (W), titanium (Ti), nickel (Ni), neodymium (Nd), molybdenum (Mo), copper (Cu), and an alloy thereof.

The data line DL, a high-potential power line HPPL, and a low-potential power line LPPL may be disposed on the substrate 110 of the display area AA.

In addition, the pad line PAD may be disposed on the substrate 110 in the non-display area NA.

The data line DL, the high-potential power line HPPL, the low-potential power line LPPL, and the pad line PAD may be formed on the same layer and made of the same metal as the first light-blocking layers 118 and 119. However, the present disclosure is not limited thereto.

A first buffer layer 111 may be disposed on the substrate 110 on which the first light-blocking layers 118 and 119, the data line DL, the high-potential power line HPPL, the low-potential power line LPPL, and the pad line PAD are disposed.

The first buffer layer 111 may be configured as a single insulating layer or have a structure in which a plurality of insulating layers is stacked in order to block foreign substances including moisture or oxygen introduced from the substrate 110. In this case, the first buffer layer 111 may be configured as a single layer or multilayer made of an inorganic insulating material such as silicon oxide (SiOx), silicon nitride (SiNx), and aluminum oxide (AlOx). The first buffer layer 111 may be eliminated depending on the types of thin-film transistors T1 and T4.

Second light-blocking layers 128 and 129 may be disposed on the first buffer layer 111.

The second light-blocking layers 128 and 129 may be disposed below the thin-film transistors T1 and T4 in the display area AA.

The second light-blocking layers 128 and 129 may be made of a metallic material having a light blocking function in order to inhibit outside light from entering the semiconductor layers ACT1 and ACT4 of the thin-film transistors T1 and T4.

The second light-blocking layers 128 and 129 may be configured as a single layer. However, for the convenience, the second light-blocking layers 128 and 129 are classified into a right second light-blocking layer 128 and a left second light-blocking layer 129.

The right second light-blocking layer 128 and the left second light-blocking layer 129 may be respectively disposed above the right first light-blocking layer 118 and the left first light-blocking layer 119 and constitute the storage capacitor.

The second light-blocking layers 128 and 129 may each be configured as a single layer or multilayer made of any one of opaque metallic materials such as aluminum (Al), chromium (Cr), tungsten (W), titanium (Ti), nickel (Ni), neodymium (Nd), molybdenum (Mo), copper (Cu), and an alloy thereof.

Meanwhile, the first light-blocking layers 118 and 119 and the second light-blocking layers 128 and 129 may each be made of metal such as Ti having a hydrogen trapping ability or a Ti alloy such as Ti/Al/Ti.

The materials constituting the first light-blocking layers 118 and 119 and the second light-blocking layers 128 and 129 may include Sc, V, Mn, Fe, Pd, Nb, Zr, Y, Ta, Ce, La, Sm, U, and the like, which are excellent in hydrogen trapping ability, in addition to Ti.

A second buffer layer 112 may be disposed on the second light-blocking layers 128 and 129.

The second buffer layer 112 may be configured as a single insulating layer or have a structure in which a plurality of insulating layers is stacked in order to block foreign substances including moisture or oxygen introduced from the substrate 110. The second buffer layer 112 may be configured as a single layer or multilayer made of an inorganic insulating material such as silicon oxide, silicon nitride, or aluminum oxide. The second buffer layer 112 may be eliminated depending on the types of thin-film transistors T1 and T4.

A first contact hole **140*a* may be formed by removing a partial area of the first buffer layer 111 and a partial area of the second buffer layer 112. A part of the right first light-blocking layer 118 is exposed through the first contact hole 140*a***.

In addition, a second contact hole **140*b* may be formed by removing a partial area of the first buffer layer 111 and a partial area of the second buffer layer 112. A part of the data line DL may be exposed through the second contact hole 140*b***.

A third contact hole **140*c* may be formed by removing a partial area of the first buffer layer 111 and a partial area of the second buffer layer 112. A part of the left first light-blocking layer 119 may be exposed through the third contact hole 140*c***.

A fourth contact hole **140*d* may be formed by removing a partial area of the first buffer layer 111 and a partial area of the second buffer layer 112. A part of the high-potential power line HPPL may be exposed through the fourth contact hole 140*d***.

A fifth contact hole may be formed by removing a partial area of the first buffer layer 111 and a partial area of the second buffer layer 112. A part of the low-potential power line LPPL may be exposed through the fifth contact hole.

A sixth contact hole may be formed by removing a partial area of the first buffer layer 111 and a partial area of the second buffer layer 112. A part of the pad line PAD may be exposed through the sixth contact hole.

The thin-film transistors T1 and T4 may be disposed on an upper portion of the second buffer layer 112.

The first thin-film transistor T1 in the display area AA may be a switching transistor. The fourth thin-film transistor T4 may be a driving transistor. However, the present disclosure is not limited thereto. The electroluminescent display device according to the present disclosure may also include a sensing transistor, a compensating circuit, and the like.

The first thin-film transistor T1 is turned on by a gate pulse supplied through the scan line SL. The first thin-film transistor T1 transmits data voltage supplied through the data line DL to a fourth gate electrode GE4 of the driving transistor T4. To this end, the first thin-film transistor T1 may include a first gate electrode GE1, a first semiconductor layer ACT1, a first source electrode, and a first drain electrode DE1.

In response to a signal received from the switching transistor T1, the fourth thin-film transistor T4 may transmit electric current, which is transmitted through the high-potential power line HPPL, to the anode 121. The fourth thin-film transistor T4 may control light emission on the basis of the electric current transmitted to the anode 121. To this end, the fourth thin-film transistor T4 may include the fourth gate electrode GE4, the fourth semiconductor layer ACT4, a fourth source electrode, and a fourth drain electrode DE4. The fourth gate electrode GE4 may herein also be referred to as a "drive gate electrode", the fourth semiconductor layer ACT4 may herein also be referred to as a "drive semiconductor layer", and the fourth drain electrode DE4 may herein also be referred to as a "drive drain electrode".

The semiconductor layers ACT1 and ACT4 may each be made of an oxide semiconductor. It is possible to ensure excellent characteristics of the display panel by using an oxide thin-film transistor having high mobility and low leakage current (off-current) properties. In particular, when the thin-film transistor in the GIP area is configured as an oxide thin-film transistor like the display area AA, the number of processes and the costs can be reduced.

The oxide semiconductor is excellent in mobility and uniformity properties. The oxide semiconductor may be made of materials based on indium-tin-gallium-zinc oxide (InSnGaZnO) which is quaternary metal oxide, materials based on indium-gallium-zinc oxide (InGaZnO), indium-tin-zinc oxide (InSnZnO), indium-aluminum-zinc oxide (InAlZnO), tin-gallium-zinc oxide (SnGaZnO), aluminum-gallium-zinc oxide (AlGaZnO), and tin-aluminum-zinc oxide (SnAlZnO) which are ternary metal oxide, materials based on indium-zinc oxide (InZnO), tin-zinc oxide (SnZnO), aluminum-zinc oxide (AlZnO), zinc-magnesium oxide (ZnMgO), tin-magnesium oxide (SnMgO), and indium-magnesium oxide (InMgO) which are binary metal oxide, materials based on indium oxide (InO), tin oxide (SnO), indium-gallium oxide (InGaO), and zinc oxide (ZnO). The present disclosure is not limited to a composition ratio of the respective elements.

In this case, one part of the first semiconductor layer ACT1 may be electrically connected to the right first light-blocking layer 118 through the first contact hole 140*a*, and another part of the first semiconductor layer ACT1 may be electrically connected to the data line DL through the second contact hole 140*b*. In this case, the storage capacitor may be provided between the first semiconductor layer ACT1, the right first light-blocking layer 118, and the right second light-blocking layer 128.

Further, one part of the fourth semiconductor layer ACT4 may be electrically connected to the left second light-blocking layer 129 through the third contact hole 140*c*, and another part of the fourth semiconductor layer ACT4 may be electrically connected to the high-potential power line HPPL through the fourth contact hole 140*d*. In this case, an additional capacitor may be provided between the fourth semiconductor layer ACT4, the left second light-blocking layer 129, and the left first light-blocking layer 119.

The semiconductor layers ACT1 and ACT4 may each include source and drain regions including p-type or n-type impurities and a channel region between the source region and the drain region. The semiconductor layers ACT1 and ACT4 may each further include a low-concentration doping region between the source and drain regions adjacent to the channel region. However, the present disclosure is not limited thereto.

The source and drain regions are regions in which impurities are doped at high concentration. The source and drain electrodes DE1 and DE4 of the thin-film transistors T1 and T4 may be respectively connected to the source and drain regions.

The p-type impurities or n-type impurities may be used as impurities ions. The p-type impurity may be one of boron (B), aluminum (Al), gallium (Ga), and indium (In). The n-type impurity may be one of phosphorus (P), arsenic (As), and antimony (Sb).

The channel region may be doped with the n-type impurities or p-type impurities depending on the structures of the thin-film transistors of NMOS or PMOS.

Meanwhile, a first connection electrode 125 may be disposed on an upper portion of the low-potential power line LPPL and electrically connected to the low-potential power line LPPL through the fifth contact hole. In addition, a second connection electrode 126 may be disposed on an upper portion of the pad line PAD and electrically connected to the pad line PAD through the sixth contact hole.

The first connection electrode 125 and the second connection electrode 126 may each be configured as a conductive semiconductor layer. However, the present disclosure is not limited thereto. As necessary, the first connection electrode 125 and the second connection electrode 126 may be eliminated. The conductive semiconductor layer may be configured as a doping layer made by doping a semiconductor layer with impurity ions. Alternatively, the conductive semiconductor layer may be configured as a conductive oxide semiconductor layer made through plasma treatment.

In addition, a part of the first semiconductor layer ACT1 may extend in a direction intersecting the data line DL and be connected to an initialization voltage supply line Vini. Meanwhile, a reference voltage line RVL may be provided on the second buffer layer 112 and disposed in a direction parallel to the initialization voltage supply line Vini. A part of the reference voltage line RVL may extend in a direction parallel to the high-potential power line HPPL. However, the present disclosure is not limited thereto.

A gate insulating layer 113 may be disposed on the semiconductor layers ACT1 and ACT4, the first connection electrode 125, and the second connection electrode 126.

The gate insulating layer 113 may be configured as a single layer or multilayer made of silicon oxide (SiOx) and silicon nitride (SiNx). The gate insulating layer 113 may be disposed between the gate electrodes GE1 and GE4 and the semiconductor layers ACT1 and ACT4 so that the electric current flowing through the semiconductor layers ACT1 and ACT4 does not flow to the gate electrodes GE1 and GE4. The silicon oxide has lower ductility than metal but has higher ductility than silicon nitride. A single layer or multilayer being made of silicon oxide may be implemented in accordance with the properties of the silicon oxide. For example, the gate insulating layer 113 may be made of, but not limited to, silicon oxide.

A seventh contact hole may be formed by removing a partial area of the gate insulating layer 113. A part of the first connection electrode 125 may be exposed through the seventh contact hole.

In addition, an eighth contact hole may be formed by removing a partial area of the gate insulating layer 113. A part of the second connection electrode 126 may be exposed through the eighth contact hole.

The gate electrodes GE1 and GE4 may be disposed on the gate insulating layer 113.

The scan line SL and a light-emitting control signal line EML may be provided on the gate insulating layer 113 and disposed in a direction intersecting the data line DL. In addition, a sensing line SSL and an initialization signal line ISL may be provided on the gate insulating layer 113 and disposed in a direction parallel to the scan line SL.

The gate electrodes GE1 and GE4 may each be configured as a single layer or multilayer made of a conductive metallic material such as copper (Cu), aluminum (Al), chromium (Cr), molybdenum (Mo), gold (Au), titanium (Ti), nickel (Ni), and neodymium (Nd), or an alloy thereof. However, the present disclosure is not limited thereto.

A protective layer 114 may be disposed on the gate electrodes GE1 and GE4.

The protective layer 114 may serve to suppress unnecessary electrical connection between the components disposed above and below the protective layer 114. The protective layer 114 may also serve to inhibit damage or contamination from the outside. The protective layer 114 may be configured as a single layer or multilayer made of silicon oxide (SiOx) or silicon nitride (SiNx).

In this case, a ninth contact hole 140*i* may be formed by removing a partial area of the gate insulating layer 113 and a partial area of the protective layer 114. A part of the first semiconductor layer ACT1 may be exposed through the ninth contact hole 140*i*.

In addition, a tenth contact hole 140*j* may be formed by removing a partial area of the protective layer 114. A part of the fourth gate electrode GE4 may be exposed through the tenth contact hole 140*j*.

In addition, an eleventh contact hole 140*k* may be formed by removing a partial area of the gate insulating layer 113 and a partial area of the protective layer 114. A part of the fourth semiconductor layer ACT4 may be exposed through the eleventh contact hole 140*k*.

In addition, a twelfth contact hole may be formed by removing a partial area of the gate insulating layer 113 and a partial area of the protective layer 114. A part of the first connection electrode 125 may be exposed through the twelfth contact hole.

In addition, a thirteenth contact hole may be formed by removing a partial area of the gate insulating layer 113 and a partial area of the protective layer 114. A part of the second connection electrode 126 may be exposed through the thirteenth contact hole.

In particular, according to the present disclosure, the ninth contact hole 140*i* is formed at an upper side of the first contact hole 140*a* and overlaps with the first contact hole 140*a*, and the eleventh contact hole 140*k* is formed at an upper side of the third contact hole 140*c* and overlaps with the third contact hole 140*c*, thereby increasing a margin. Therefore, a parasitic capacity with the peripheral data line DL or the high-potential power line HPPL can be reduced, thereby increasing a charging rate of the storage capacitor (shown in FIG. 4). In this case, in the FIG. 4, for the convenience of description, the illustration of the first drain electrode DE1 formed in the ninth contact hole 140*i* is omitted. Referring to FIG. 4, it can be seen that the ninth contact hole 140*i* is formed at an upper side of the first contact hole 140*a* based on the dotted line and overlaps with the first contact hole 140*a*.

A first planarization layer 115 may be disposed on the protective layer 114.

The first planarization layer 115 may be made of, but not limited to, one or more materials among acrylic resin, epoxy resin, phenolic resin, polyamide-based resin, polyimide-based resin, unsaturated polyester-based resin, polyphenylene-based resin, polyphenylene sulfide-based resin, and benzocyclobutene. However, the present disclosure is not limited thereto.

In this case, an open area may be formed by removing a partial area of the first planarization layer 115. A part of the ninth contact hole 140*i*, a part of the tenth contact hole 140*j*, and a part of the protective layer 114 may be exposed through the open area.

In addition, a fourteenth contact hole may be formed by removing a partial area of the first planarization layer 115. The eleventh contact hole 140*k* may be exposed through the fourteenth contact hole.

A fifteenth contact hole may be formed by removing a partial area of the first planarization layer 115. The twelfth contact hole may be exposed through the fifteenth contact hole.

The thirteenth contact hole may be exposed by removing a partial area of the first planarization layer 115 in the non-display area NA.

The source and drain electrodes DE1 and DE4 may be disposed on an upper portion of the protective layer 114 and an upper portion of the first planarization layer 115. However, according to the present disclosure, the source electrode may be eliminated when a part of the data line DL or a part of the high-potential power line HPPL constitutes the source electrode.

In this case, the first drain electrode DE1 may be disposed on the protective layer 114 in the open area. One part of the first drain electrode DE1 may be electrically connected to the first semiconductor layer ACT1 through the ninth contact hole 140*i*, and another part of the first drain electrode DE1 may be electrically connected to the fourth gate electrode GE4 through the tenth contact hole 140*j*.

The fourth drain electrode DE4 may be disposed on the first planarization layer 115 and electrically connected to the fourth semiconductor layer ACT4 through the fourteenth contact hole.

Since the first drain electrode DE1 is disposed on the first planarization layer 115 in the open area as described above, a vertical level difference is formed between the identical types of electrodes, i.e., between the first drain electrode DE1 and the fourth drain electrode DE4. Therefore, a short-circuit defect between the identical types of electrodes can be suppressed and the parasitic capacity can also be reduced, thereby reducing intervals between the identical types of electrodes (shown in FIG. 5). In addition, an area of the first drain electrode DE1 and an area of the fourth drain electrode DE4 may increase. Therefore, the charge amount may increase, such that inspection accuracy may be improved. In addition, a high-mobility oxide thin-film transistor may be very vulnerable to hydrogen from the sealing layer. Referring to FIG. 5, in the case of the first aspect of the present disclosure, the first and fourth drain electrodes DE1 and DE4, which are hydrogen trapping layers, may be disposed in the open area OA made by removing the first planarization layer 115, thereby improving a hydrogen trapping effect. That is, a part of the first drain electrode DE1 is opened, and the first and fourth drain electrodes DE1 and DE4 may be disposed on the protective layer 114 closer to the oxide thin-film transistors T1 and T4, thereby further improving the hydrogen trapping effect.

An additional low-potential power line 135 may be disposed on the protective layer 114. The additional low-potential power line 135 may be electrically connected to the first connection electrode 125 through the fifteenth contact hole. Therefore, the additional low-potential power line 135 may be electrically connected to the low-potential power line LPPL.

The additional low-potential power line 135, together with the low-potential power line LPPL, may supply low-potential power signals, thereby maintaining uniform power in a large-area display panel.

The additional low-potential power line 135 may be provided around the data line DL and disposed in the direction parallel to the data line DL. However, the present disclosure is not limited thereto.

A pad electrode 136 may be disposed on the protective layer 114. The pad electrode 136 may be electrically connected to the second connection electrode 126 through the exposed thirteenth contact hole.

The additional low-potential power line 135, the pad electrode 136, and the first and fourth drain electrodes DE1 and DE4 may each be configured as a single layer or multilayer made of a conductive metallic material such as aluminum (Al), molybdenum (Mo), chromium (Cr), gold (Au), titanium (Ti), nickel (Ni), copper (Cu), or neodymium (Nd), or an alloy thereof. However, the present disclosure is not limited thereto.

In particular, the first and fourth drain electrodes DE1 and DE4 may each be made of metal such as Ti having a hydrogen trapping ability or a Ti alloy such as Ti/Al/Ti.

The materials constituting the first and fourth drain electrodes DE1 and DE4 may include Sc, V, Mn, Fe, Pd, Nb, Zr, Y, Ta, Ce, La, Sm, U, and the like, which are excellent in hydrogen trapping ability, in addition to Ti.

For reference, TiH has better hydrogen solubility than AlH, NiH, AgH, CuH, and ZnH.

In the case of metal hydride, for example, hydride of Ti is TiH2.00, and this means that two hydrogen (H) atoms may be stored for each titanium (Ti) atom. It can be seen that TiH2.00 is better in hydrogen adsorption ability as much as million times than AlH<2.5×10-8 which is hydride of Al.

It can be seen that hydrides of Sc, V, Pd, Nb, Zr, Y, Ta, Ce, La, Sm, and U are ScH>1.86, VH1.00, PdH0.724, NbH1.1, ZrH>1.70, YH>2.85, TaH0.79, CeH>2.5, LaH>2.03, SmH3.00, and UH>3.00, respectively.

As described above, according to the present disclosure, the drain electrodes DE1 and DE4, which serve to trap hydrogen, are formed above the oxide thin-film transistors T1 and T4, thereby inhibiting hydrogen from entering the oxide thin-film transistors T1 and T4. Therefore, it is possible to improve properties and reliability of the oxide thin-film transistors T1 and T4.

Meanwhile, an additional high-potential power line HPPL' may be disposed on the first planarization layer 115. The additional high-potential power line HPPL', together with the high-potential power line HPPL, may supply high-potential power signals, thereby maintaining uniform power in a large-area display panel.

The additional high-potential power line HPPL' may be provided around the high-potential power line HPPL and disposed in the direction parallel to the high-potential power line HPPL. However, the present disclosure is not limited thereto.

The thin-film transistors T1 and T4 may be classified into a coplanar structure and an inverted staggered structure depending on the positions of the components constituting the thin-film transistors T1 and T4. In this case, for example, in the case of the thin-film transistor having the inverted staggered structure, the gate electrode may be positioned at a side opposite to the source electrode and the drain electrode based on the semiconductor layer. As illustrated in FIG. 3, in the case of the thin-film transistors T1 and T4 each having the coplanar structure, the gate electrodes GE1 and GE4 may be positioned at the same sides as the first and fourth drain electrodes DE1 and DE4 based on the semiconductor layers ACT1 and ACT4.

FIG. 3 illustrates the thin-film transistors T1 and T4 each having the coplanar structure, as an example. However, the electroluminescent display device according to the first aspect of the present disclosure may also include the thin-film transistor having the inverted staggered structure.

In addition, one of the thin-film transistors T1 and T4 may have the coplanar structure, and the other of the thin-film transistors T1 and T4 may have the inverted staggered structure. In addition, the thin-film transistors T1 and T4 according to the present disclosure may have a structure having a combination of the coplanar structure and the inverted staggered structure.

A protective layer may be additionally disposed above the thin-film transistors T1 and T4.

The protective layer may serve to suppress unnecessary electrical connection between the components disposed above and below the protective layer. The protective layer may also serve to inhibit damage or contamination from the outside.

A second planarization layer 116 may be disposed on the thin-film transistors T1 and T4. The second planarization layer 116 may be disposed above the thin-film transistors T1 and T4 to protect the thin-film transistors T1 and T4, reduce a level difference therebetween, and reduce parasitic capacitance occurring between the thin-film transistors T1 and T4, the scan line SL, the data line DL, and the light-emitting element 120.

The second planarization layer 116 may be made of, but not limited to, one or more materials among acrylic resin, epoxy resin, phenolic resin, polyamide-based resin, polyimide-based resin, unsaturated polyester-based resin, polyphenylene-based resin, polyphenylene sulfide-based resin, and benzocyclobutene. However, the present disclosure is not limited thereto.

The first and second planarization layers 115 and 116 may be disposed to extend to a part of the non-display area NA. In addition, the first and second planarization layers 115 and 116 may be disposed to extend to a part of the non-display area NA so as to expose the pad electrode 136.

A sixteenth contact hole 140*o* may be formed by removing a partial area of the second planarization layer 116. A part of the fourth drain electrode DE4 may be exposed through the sixteenth contact hole 140*o*.

The light-emitting element 120 including the anode 121, the light-emitting part 122, and the cathode 123 may be disposed on the second planarization layer 116.

The anode 121 may be disposed on the second planarization layer 116.

The anode 121 is an electrode that serves to supply positive holes to the light-emitting part 122. The anode 121 may be electrically connected to the fourth thin-film transistor T4 through the sixteenth contact hole 140*o*.

In the case of the bottom emission type display panel that emits light toward the lower side at which the anode 121 is disposed, the anode 121 may be made of, but not limited to, indium-tin oxide (ITO), indium-zinc oxide (IZO), or the like, which is a transparent electrically conductive material. However, the present disclosure is not limited thereto.

In contrast, in the case of the top emission type display panel that emits light toward the upper side at which the cathode 123 is disposed, the display panel may further include a reflective layer so that the emitted light may be reflected by the anode 121 and more smoothly discharged to the upper side at which the cathode 123 is disposed.

That is, the anode 121 may have a two-layer structure in which a reflective layer and a transparent conductive layer made of a transparent electrically conductive material are sequentially stacked. Alternatively, the anode 121 may have a three-layer structure in which the transparent conductive layer, the reflective layer, and the transparent conductive layer are sequentially stacked. The reflective layer may be made of an alloy containing silver (Ag).

A bank 150 may be disposed on the anode 121 and the second planarization layer 116.

The bank 150 disposed on an upper portion of the anode 121 and an upper portion of the second planarization layer 116 may define the subpixel SP by dividing an area in which light is actually emitted, i.e., a light-emitting area.

The bank 150 may be formed by performing photolithography after forming a photoresist on the upper portion of the anode 121. The photoresist refers to photosensitive resin having solubility that is changed in respect to a developer by the action of light. A particular pattern may be obtained by exposing and developing the photoresist. The photoresists may be classified into a positive photoresist and a negative photoresist. In this case, the positive photoresist refers to a photoresist in which solubility of an exposed part in respect to a developer is increased by exposure. When the positive photoresist is developed, a pattern from which the exposed part is removed is obtained. The negative photoresist refers to a photoresist in which solubility of an exposed part in respect to a developer is decreased by exposure. When the negative photoresist is developed, a pattern from which a non-exposed part is removed is obtained.

A fine metal mask (FMM), which is a deposition mask, may be used to form the light-emitting part 122 of the light-emitting element 120.

In addition, a spacer 156 may be disposed on an upper portion of the bank 150 and made of one of polyimide, photo acrylic, and benzocyclobutene which are transparent organic materials. The spacer 156 is used to inhibit damage caused by contact with the deposition mask disposed on the bank 150. The spacer 156 serves to maintain a predetermined distance between the bank 150 and the deposition mask.

An opening portion OP may be formed by removing a part of the bank 150 in the light-emitting area. A part of the anode 121 may be exposed through the opening portion OP.

Meanwhile, a plurality of trench patterns 155 may be formed by removing a partial area of the bank 150 between the subpixels SP.

The plurality of trench patterns 155 may be disposed between the plurality of subpixels SP. The trench pattern 155 may be formed by removing a part of a thickness of the upper portion of the bank 119, but the present disclosure is not limited thereto. The trench pattern 155 may be formed by removing the overall thickness of the bank 119.

The trench pattern 155 decreases a thickness of the light-emitting part 122 between the adjacent subpixels SP or increases a path. Alternatively, the trench pattern 155 disconnects (cuts) a part of the light-emitting part 122 between the adjacent subpixels SP. Therefore, it is possible to minimize leakage current caused by the light-emitting part 122 between the adjacent subpixels SP.

The trench pattern 155 may minimize lateral leakage current that occurs in a multi-stack structure.

That is, in order to improve quality and productivity of the electroluminescent display device, there have been proposed structures of various light-emitting elements for improving efficiency of the light-emitting element, increasing the lifespan, and reducing the power consumption.

Therefore, there has been proposed the structure of the light-emitting element to which a single stack, i.e., a single light-emitting unit (an electroluminescence (EL) unit) is applied. Further, there also has been proposed the light-emitting element having a tandem structure that uses a plurality of stacks, for example, a stack of a plurality of light-emitting units in order to implement improved efficiency and lifespan properties.

In the case of the tandem structure, i.e., the light-emitting element having a two-stack structure using a stack of a first light-emitting unit and a second light-emitting unit, the light-emitting regions in which light is emitted by recombination of electrons and holes are positioned in the first light-emitting unit and the second light-emitting unit, respectively. As a result, light emitted from a first light-emitting layer in the first light-emitting unit and light emitted from a second light-emitting layer in the second light-emitting unit may generate reinforcement interference, thereby providing higher brightness in comparison with a light-emitting element having a single stack structure.

In addition, in the light-emitting element, a distance between the plurality of subpixels constituting one pixel decreases as the electroluminescent display device has high resolution. Except for the light-emitting layer (emission layer (EML)), auxiliary organic layers, such as a hole injection layer (HIL), a hole transport layer (HTL), a charge generating layer (CGL), an electron injection layer (EIL), and an electron transport layer (ETL), are formed in the common layer by deposition using a common mask so as to correspond to all the plurality of subpixels. The light-emitting layers in the plurality of subpixels for generating light beams with different wavelengths may be individually formed by deposition using a fine metal mask so as to correspond to the respective subpixels.

In the case of the above-mentioned light-emitting element, horizontal leakage current (lateral leakage current) occurs in the horizontal direction of the light-emitting element through the common layer formed in the light-emitting element when the voltage is applied between the anode and the cathode. For this reason, a color mixture defect occurs because not only the subpixel required to emit light emits light, but also an undesired subpixel positioned adjacent to the subpixel, which is required to emit light, emits light.

The color mixture defect may become severer on the light-emitting element having the two-stack structure including the stack of the first and second light-emitting units using reinforcing interference in comparison with the light-emitting element having the single-stack structure.

Therefore, according to the present disclosure, as illustrated in FIGS. 2 and 3, the trench patterns 155 are formed between the plurality of subpixels SP. The trench pattern 155 may decrease a thickness of the light-emitting part 122 between the adjacent subpixels SP or increase the path. Alternatively, the trench pattern 155 may disconnect (cut) a part of the light-emitting part 122 between the adjacent subpixels SP. Therefore, it is possible to minimize leakage current caused by the light-emitting part 122 between the adjacent subpixels SP.

The bank 150 may be disposed to extend to a part of the non-display area NA, but the present disclosure is not limited thereto.

The light-emitting part 122 may be disposed between the anode 121 and the cathode 123.

The light-emitting part 122 serves to emit light. The light-emitting part 122 may include at least one of a hole injection layer (HIL), a hole transport layer (HTL), a light-emitting layer, an electron transport layer (ETL), and an electron injection layer (EIL). Some components may be eliminated depending on the structure or properties of the electroluminescent display device. In this case, an electroluminescent layer and an inorganic light-emitting layer may be applied as the light-emitting layer.

The hole injection layer is disposed on the anode 121 and serves to facilitate the injection of the positive holes.

The hole transport layer is disposed on the hole injection layer and serves to smoothly transmit the positive holes to the light-emitting layer.

The light-emitting layer is disposed on the hole transport layer. The light-emitting layer may be made of a material capable of emitting light with a particular color, thereby emitting the light with the particular color. Further, a phosphorescent material or a fluorescent material may be used as the light-emitting material.

The electron injection layer may further be disposed on the electron transport layer. The electron injection layer is an organic layer that facilitates the injection of electrons from the cathode 123. The electron injection layer may be eliminated depending on the structure and properties of the electroluminescent display device.

Meanwhile, an electron blocking layer for blocking a flow of electrons or a hole blocking layer for blocking a flow of positive holes is further disposed at a position adjacent to the light-emitting layer. Therefore, it is possible to inhibit the electron from moving from the light-emitting layer and passing through the adjacent hole transport layer when the electrons are injected into the light-emitting layer or inhibit the positive hole from moving from the light-emitting layer and passing through the adjacent electron transport layer when the positive holes are injected into the light-emitting layer, thereby improving luminous efficiency.

The cathode 123 is disposed on the light-emitting part 122 and serves to supply the electrons to the light-emitting part 122. In the case of the bottom-emission type display panel, the cathode 123 needs to supply electrons. Therefore, the cathode 123 may be made of a metallic material such as magnesium, silver-magnesium, or the like that is an electrically conductive material having a low work function. However, the present disclosure is not limited thereto.

In contrast, in the case of the top-emission display panel, the cathode 123 may be made of transparent conductive oxide such as indium tin oxide (ITO), indium zinc oxide (IZO), indium-tin-zinc oxide (ITZO), zinc oxide (ZnO), and tin oxide (TO).

A sealing layer (not illustrated) may be disposed on the cathode 123.

The sealing layer will be specifically described. A capping layer is formed on a top surface of the substrate 110 having the light-emitting element 120, and a primary protective film, an organic film, and a secondary protective film are sequentially formed on the capping layer, thereby configuring the sealing layer that is a sealing means. However, the number of inorganic and organic films constituting the sealing layer is not limited thereto.

The primary protective film is configured as an inorganic insulating film and thus does not have good stack coverage because of a level difference at a lower side thereof. However, the planarization is performed to the organic film, such that the secondary protective film is not affected by a level difference caused by a lower film. In addition, the organic film made of polymer may have a sufficiently large thickness, thereby solving a problem of cracks caused by foreign substances.

The protective films disposed in multiple layers for sealing may be positioned on a front surface of the substrate 110 including the secondary protective film so as to be opposite to each other. A transparent adhesive agent having adhesive properties may be interposed between the sealing layer and the protective film.

A polarizing plate may be attached onto the protective film to suppress the reflection of light introduced from the outside, but the present disclosure is not limited thereto.

Meanwhile, according to the present disclosure, the number of mask processes required to manufacture the oxide thin-film transistor may be reduced, thereby improving productivity and reducing the number of processes and material costs. That is, in the related art, a total of thirteen mask processes are required to perform from the process of forming the first light-blocking layer and up to the process of forming the light-emitting element. In contrast, according to the present disclosure, the data line is formed on the same layer as the first light-blocking layer, an intermediate electrode for electrically connecting the anode is eliminated, and a protective layer is eliminated, such that a total of eleven to twelve mask processes are required for the manufacturing process.

Meanwhile, as described above, the second connection electrode in the non-display area may be eliminated, as necessary. This configuration will be described with reference to FIG. 6.

Figure 6:
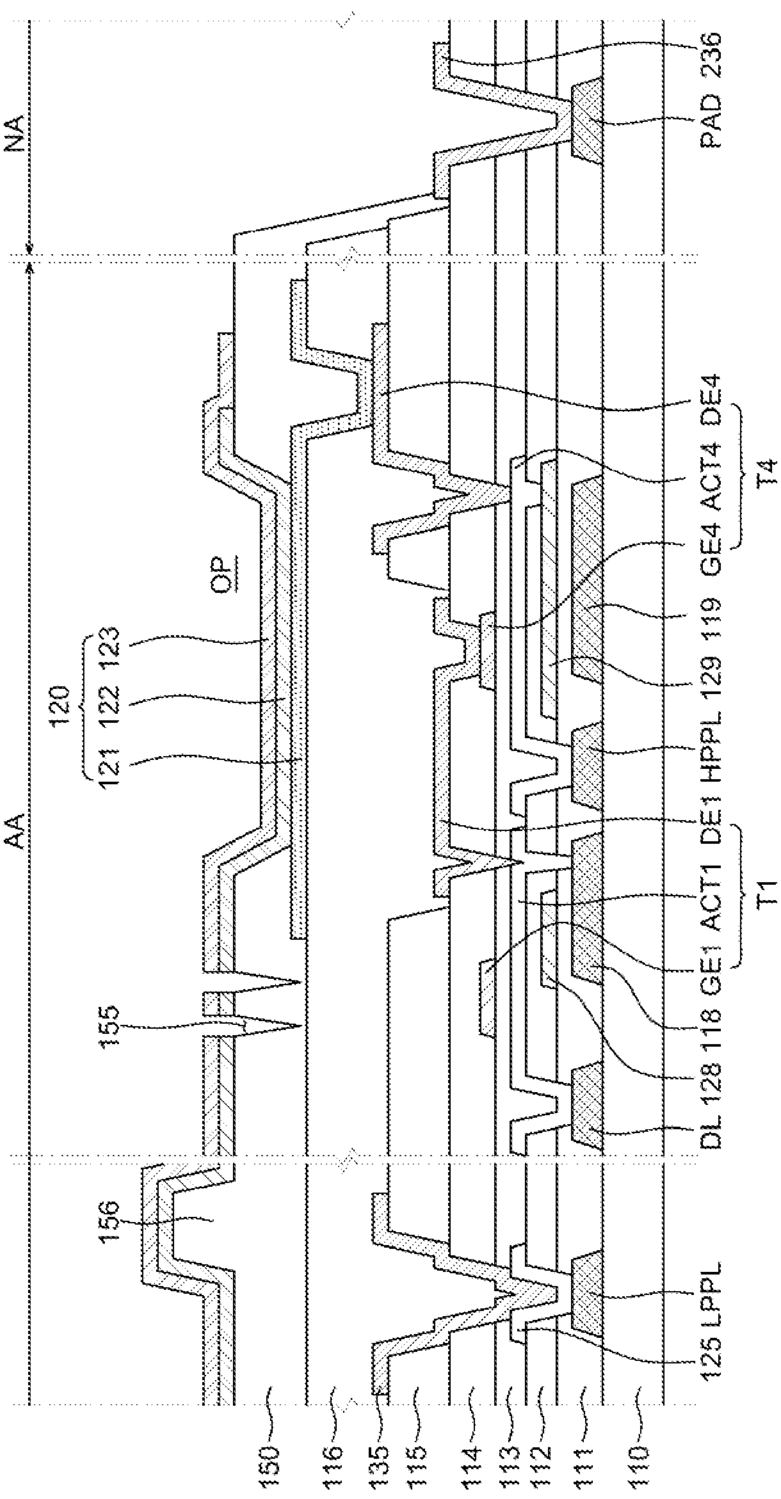
FIG. 6 is a cross-sectional view of an electroluminescent display device according to a second aspect of the present disclosure.

FIG. 6 is a cross-sectional view of an electroluminescent display device according to a second aspect of the present disclosure.

The second aspect illustrated in FIG. 6 is substantially identical in configuration to the first aspect illustrated in FIGS. 2 and 3 but differs from the first aspect in that the pad line PAD is electrically connected directly to a pad electrode 236 without the second connection electrode. Therefore, repeated descriptions of the identical components will be omitted. The same reference numerals are used for the same components.

Referring to FIG. 6, the thin-film transistors T1 and T4, the light-emitting element 120, and the sealing layer (not illustrated) may be disposed on the upper portion of the substrate 110 in the display area AA.

The pad line PAD and the sealing layer may be disposed on the upper portion of the substrate 110 in the non-display area NA.

The first light-blocking layers 118 and 119 and the second light-blocking layers 128 and 129 may be disposed below the thin-film transistors T1 and T4 in the display area AA.

The first light-blocking layers 118 and 119 and the second light-blocking layers 128 and 129 may each be made of metal such as Ti having a hydrogen trapping ability or a Ti alloy such as Ti/Al/Ti.

The materials constituting the first light-blocking layers 118 and 119 and the second light-blocking layers 128 and 129 may include Sc, V, Mn, Fe, Pd, Nb, Zr, Y, Ta, Ce, La, Sm, U, and the like, which are excellent in hydrogen trapping ability, in addition to Ti.

The thin-film transistors T1 and T4 may be disposed on the upper portion of the second buffer layer 112.

The first thin-film transistor T1 may include the first gate electrode GE1, the first semiconductor layer ACT1, the first source electrode, and the first drain electrode DE1.

The fourth thin-film transistor T4 may include the fourth gate electrode GE4, the fourth semiconductor layer ACT4, the fourth source electrode, and the fourth drain electrode DE4.

The thin-film transistors T1 and T4 according to the present disclosure may include the semiconductor layers ACT1 and ACT4 each made of an oxide semiconductor.

The drain electrodes DE1 and DE4 may be disposed on the upper portion of the protective layer 114 and the upper portion of the first planarization layer 115.

Since the first drain electrode DE1 is disposed on the first planarization layer 115 in the open area as described above, a vertical level difference is formed between the identical types of electrodes, i.e., between the first drain electrode DE1 and the fourth drain electrode DE4. Therefore, a short-circuit defect between the identical types of electrodes can be suppressed and the parasitic capacity can also be reduced, thereby reducing intervals between the identical types of electrodes. In addition, an area of the first drain electrode DE1 and an area of the fourth drain electrode DE4 may increase. Therefore, the charge amount may increase, such that inspection accuracy may be improved.

In addition, the pad electrode 236 may be disposed on the protective layer 114.

The pad electrode 236 according to the second aspect of the present disclosure may be electrically connected to the pad line PAD without the second connection electrode according to the first aspect described above. That is, the pad electrode 236 may be electrically connected to the pad line PAD disposed below the pad electrode 236 through at least one contact hole.

The pad electrode 236 and the first and fourth drain electrodes DE1 and DE4 may each be made of metal such as Ti having a hydrogen trapping ability or a Ti alloy such as Ti/Al/Ti.

The materials constituting the pad electrode 236 and the first and fourth drain electrodes DE1 and DE4 may include Sc, V, Mn, Fe, Pd, Nb, Zr, Y, Ta, Ce, La, Sm, U, and the like, which are excellent in hydrogen trapping ability, in addition to Ti.

The first and second planarization layers 115 and 116 may be disposed to extend to a part of the non-display area NA so as to expose the pad electrode 236.

In addition, the bank 150 may be disposed to extend to a part of the non-display area NA to cover a part of the top surface of the pad electrode 236 while covering the first and second planarization layers 115 and 116.

According to the first and second aspects of the present disclosure, a total of twelve mask processes are required to perform from the process of forming the first light-blocking layer up to the process of forming the light-emitting element. Therefore, it is possible to reduce the number of mask processes by one. As a result, it is possible to improve productivity and reduce the number of processes and material costs. In particular, according to the second aspect, the pad electrode 236 is electrically connected to the pad line PAD without the second connection electrode. Therefore, the processes of forming the second connection electrode and making the second connection electrode conductive may be eliminated, which makes it possible to reduce the number of processes.

Meanwhile, according to the present disclosure, the protective layer disposed on the gate electrode may be eliminated unless the gate electrode is made of Cu or a top layer thereof is made of Cu, such that the number of mask processes may further be reduced by one. This configuration will be described with reference to FIG. 7.

Figure 7:
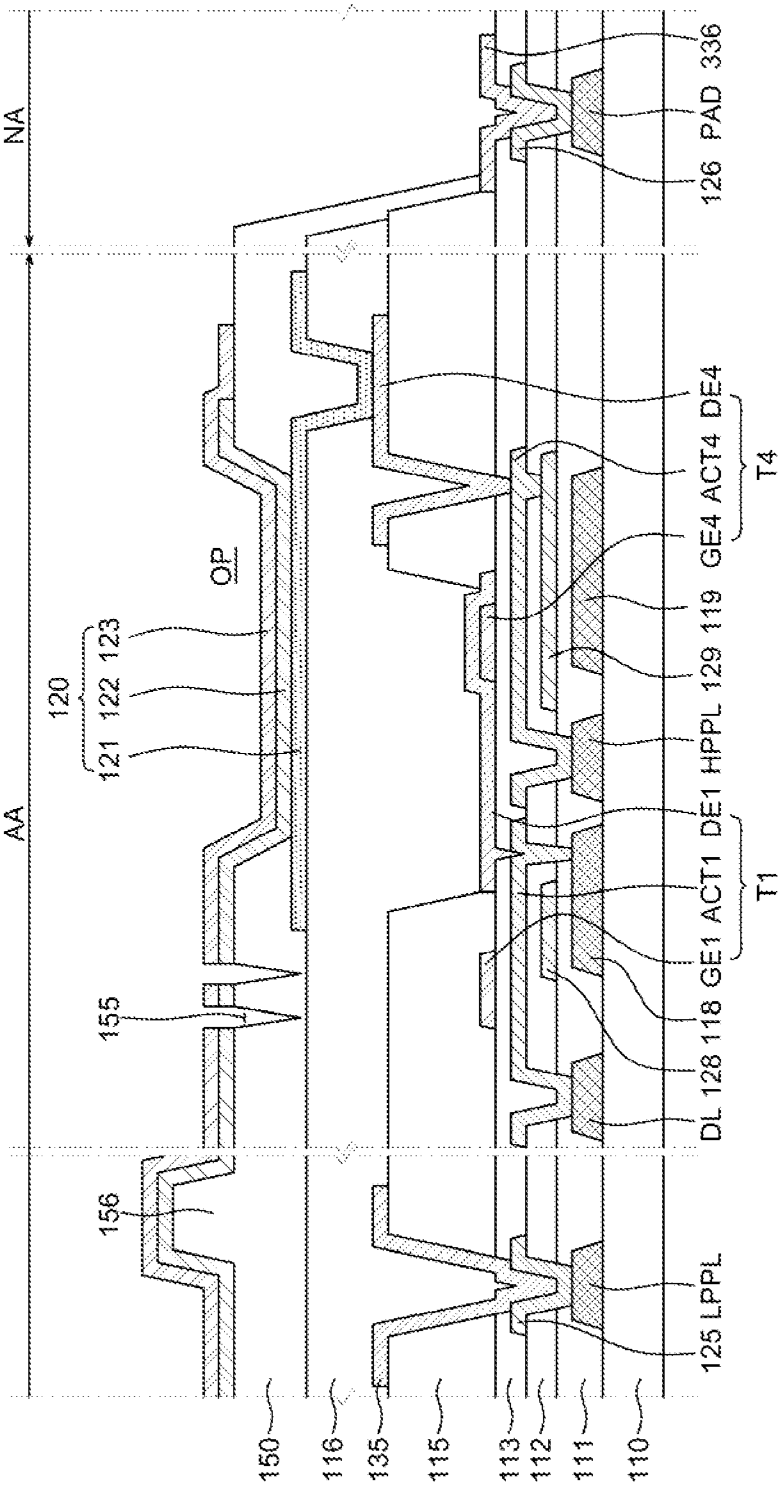
FIG. 7 is a cross-sectional view of an electroluminescent display device according to a third aspect of the present disclosure.

FIG. 7 is a cross-sectional view of an electroluminescent display device according to a third aspect of the present disclosure.

The third aspect illustrated in FIG. 7 is substantially identical in configuration to the above-mentioned first aspect illustrated in FIGS. 2 and 3 but differs from the first aspect in that the protective layer disposed on the first and fourth gate electrodes GE1 and GE4 is eliminated. Therefore, repeated descriptions of the identical components will be omitted. The same reference numerals are used for the same components.

Referring to FIG. 7, the thin-film transistors T1 and T4, the light-emitting element 120, and the sealing layer (not illustrated) may be disposed on the upper portion of the substrate 110 in the display area AA.

The pad line PAD and the sealing layer may be disposed on the upper portion of the substrate 110 in the non-display area NA.

The first light-blocking layers 118 and 119 and the second light-blocking layers 128 and 129 may be disposed below the thin-film transistors T1 and T4 in the display area AA.

For example, the first light-blocking layers 118 and 119 may each be made of Cu/MoTi, and the second light-blocking layers 128 and 129 may each be made of MoTi or ITO. However, the present disclosure is not limited thereto.

In addition, the first light-blocking layers 118 and 119 and the second light-blocking layers 128 and 129 may each be made of metal such as Ti having a hydrogen trapping ability or a Ti alloy such as Ti/Al/Ti.

The materials constituting the first light-blocking layers 118 and 119 and the second light-blocking layers 128 and 129 may include Sc, V, Mn, Fe, Pd, Nb, Zr, Y, Ta, Ce, La, Sm, U, and the like, which are excellent in hydrogen trapping ability, in addition to Ti.

The first buffer layer 111 may be disposed on the first light-blocking layers 118 and 119, and the second buffer layer 112 may be disposed on the second light-blocking layers 128 and 129.

In this case, the first and second buffer layers 111 and 112 may be configured as a single layer or multilayer made of silicon oxide (SiOx) or silicon nitride (SiNx), but the present disclosure is not limited thereto.

The first and fourth semiconductor layers ACT1 and ACT4 may be disposed on the second buffer layer 112.

The first and fourth semiconductor layers ACT1 and ACT4 may each be made of an oxide semiconductor.

The second connection electrode 126 may be disposed on the same layer as the first and fourth semiconductor layers ACT1 and ACT4. The second connection electrode 126 is configured as a conductive semiconductor layer and electrically connected to the pad line PAD. However, the second connection electrode 126 may be eliminated, as necessary.

The gate insulating layer 113 made of silicon oxide (SiOx) may be disposed on the first and fourth semiconductor layers ACT1 and ACT4 and the second connection electrode 126.

The first and fourth gate electrodes GE1 and GE4 may be disposed on the gate insulating layer 113.

For example, the first and fourth gate electrodes GE1 and GE4 may each be made of Mo, MoTi, or Ti/Al/Ti, but the present disclosure is not limited thereto. In particular, the first and fourth gate electrodes GE1 and GE4 according to the third aspect of the present disclosure may be configured as a single layer or multilayer made of a conductive material except that the first and fourth gate electrodes GE1 and GE4 are made of Cu or the top layers thereof are made of Cu.

Therefore, the first planarization layer 115 provided in the form of an organic film may be disposed on the first and fourth gate electrodes GE1 and GE4.

The first planarization layer 115 may be made of, but not limited to, one or more materials among acrylic resin, epoxy resin, phenolic resin, polyamide-based resin, polyimide-based resin, unsaturated polyester-based resin, polyphenylene-based resin, polyphenylene sulfide-based resin, and benzocyclobutene. However, the present disclosure is not limited thereto.

According to the third aspect of the present disclosure, the first and fourth gate electrodes GE1 and GE4 may each be made of a conductive material except for Cu. Therefore, the first planarization layer 115 provided in the form of an organic film may be disposed directly on the first and fourth gate electrodes GE1 and GE4. That is, interface properties are not good when an organic film is deposited on Cu. Therefore, when the gate electrode is made of Cu, the protective layer provided in the form of an inorganic film is disposed, and then the first planarization layer is disposed.

According to the third aspect of the present disclosure, the drain electrodes DE1 and DE4 may be disposed on the upper portion of the gate insulating layer 113 and the upper portion of the first planarization layer 115.

That is, the first drain electrode DE1 may be disposed on the gate insulating layer 113 in the open area. One part of the first drain electrode DE1 may be electrically connected to the first semiconductor layer ACT1 through the contact hole, and another part of the first drain electrode DE1 may be connected directly to the fourth gate electrode GE4.

In addition, the fourth drain electrode DE4 may be disposed on the first planarization layer 115 and electrically connected to the fourth semiconductor layer ACT4 through the contact hole.

Since the first drain electrode DE1 is disposed on the gate insulating layer 113 in the open area as described above, a vertical level difference is formed between the identical types of electrodes, i.e., between the first drain electrode DE1 and the fourth drain electrode DE4. Therefore, a short-circuit defect between the identical types of electrodes can be suppressed and the parasitic capacity can also be reduced, thereby reducing intervals between the identical types of electrodes. In addition, an area of the first drain electrode DE1 and an area of the fourth drain electrode DE4 may increase. Therefore, the charge amount may increase, such that inspection accuracy may be improved.

The first and fourth drain electrodes DE1 and DE4 may each be made of metal such as Ti having a hydrogen trapping ability or a Ti alloy such as Ti/Al/Ti.

In addition, the materials constituting the first and fourth drain electrodes DE1 and DE4 may include Sc, V, Mn, Fe, Pd, Nb, Zr, Y, Ta, Ce, La, Sm, U, and the like, which are excellent in hydrogen trapping ability, in addition to Ti.

In particular, according to the third aspect, the protective layer is eliminated, and a distance between the first and fourth drain electrodes DE1 and DE4 and the oxide thin-film transistors T1 and T4 is decreased, which makes it possible to maximize the hydrogen trapping effect.

In addition, according to the third aspect of the present disclosure, the protective layer is eliminated, such that a total of eleven mask processes are required to perform from the process of forming the first light-blocking layer up to the process of forming the light-emitting element. Therefore, it is possible to reduce the number of mask processes by one in comparison with the first and second aspects. As a result, it is possible to further improve productivity and further reduce the number of processes and material costs.

The exemplary aspects of the present disclosure can also be described as follows:

According to an aspect of the present disclosure, there is provided an electroluminescent display device. The electroluminescent display device includes a substrate divided into a display area and a non-display area, a first light-blocking layer and a data line disposed on the substrate in the display area, a first buffer layer disposed on the first light-blocking layer and the data line, a semiconductor layer disposed on an upper portion of the first buffer layer and made of an oxide semiconductor, a gate insulating layer disposed on the semiconductor layer, a gate electrode disposed on the gate insulating layer, a protective layer and a first planarization layer disposed on an upper portion of the gate electrode, a drain electrode disposed on an exposed part of the protective layer where a partial area of the first planarization layer is removed, a second planarization layer disposed on the drain electrode and the first planarization layer and a light-emitting element disposed on an upper portion of the second planarization layer and comprising an anode, a light-emitting part, and a cathode.

According to another aspect of the present disclosure, there is provided an electroluminescent display device. The electroluminescent display device includes a substrate divided into a display area and a non-display area, a first light-blocking layer and a data line disposed on the substrate in the display area, a first buffer layer disposed on the first light-blocking layer and the data line, a semiconductor layer on an upper portion of the first buffer layer and made of an oxide semiconductor, a gate insulating layer disposed on the semiconductor layer, a gate electrode disposed on the gate insulating layer, a first planarization layer disposed on the gate electrode, a drain electrode disposed on an exposed part of the gate insulating layer where a partial area of the first planarization layer is removed, a second planarization layer disposed on the drain electrode and the first planarization layer and a light-emitting element disposed on an upper portion of the second planarization layer and comprising an anode, a light-emitting part and a cathode.

The electroluminescent display device may further include a second light-blocking layer disposed on the first buffer layer and overlapping with the first light-blocking layer and a second buffer layer disposed on the second light-blocking layer, wherein the semiconductor layer may be disposed on the second buffer layer.

The first light-blocking layer and the second light-blocking layer may be made of Ti or a Ti alloy.

One part of the semiconductor layer may be electrically connected to the data line, and another part of the semiconductor layer may be electrically connected to the first light-blocking layer.

The semiconductor layer may be connected to the first light-blocking layer through a first light-blocking layer contact hole, the drain electrode may be connected to the semiconductor layer through a drain contact hole, and the first light-blocking layer contact hole and the drain contact hole may overlap with each other.

The electroluminescent display device may further include a high-potential power line disposed on the substrate, a second light-blocking layer disposed on the first buffer layer and a drive semiconductor layer disposed on a same layer as the semiconductor layer and made of the oxide semiconductor.

The electroluminescent display device may further include a drive gate electrode disposed on an upper portion of the drive semiconductor layer, wherein the drain electrode may be electrically connected to the drive gate electrode through a contact hole.

The electroluminescent display device may further include a drive drain electrode disposed on an upper portion of the protective layer and an upper portion of the first planarization layer and electrically connected to the drive semiconductor layer.

The electroluminescent display device may further include a high-potential power line disposed on the substrate, a second light-blocking layer disposed on the first buffer layer and a drive semiconductor layer disposed on a same layer as the semiconductor layer and made of the oxide semiconductor.

The electroluminescent display device may further include a drive gate electrode disposed on an upper portion of the drive semiconductor layer, wherein the drain electrode may be connected directly to the drive gate electrode.

The electroluminescent display device may further include a drive drain electrode disposed on the first planarization layer and electrically connected to the drive semiconductor layer.

One part of the drive semiconductor layer may be electrically connected to the high-potential power line, and another part of the drive semiconductor layer may be electrically connected to the second light-blocking layer.

The drain electrode and the drive drain electrode may be made of Ti or a Ti alloy.

The drive semiconductor layer may be connected to the second light-blocking layer through a second light-blocking layer contact hole, the drive drain electrode may be connected to the drive semiconductor layer through a drive drain contact hole, and the second light-blocking layer contact hole and the drive drain contact hole may overlap with each other.

The electroluminescent display device may further include a pad line disposed on the substrate in the non-display area.

The electroluminescent display device may further include a connection electrode disposed on the second buffer layer and electrically connected to the pad line, wherein the connection electrode may be made of a conductive semiconductor of the oxide semiconductor.

The electroluminescent display device may further include a pad electrode disposed on the protective layer and electrically connected to the connection electrode, wherein the pad electrode may be disposed on a same layer as the drain electrode and made of a same conductive material as the drain electrode.

The electroluminescent display device may further include a pad electrode disposed on the protective layer and electrically connected to the pad line, wherein the pad electrode may be disposed on a same layer as the drain electrode and made of a same conductive material as the drain electrode.

The electroluminescent display device may further include a bank disposed on the second planarization layer and comprising an opening portion through which a part of the anode is exposed, wherein a partial area of the bank is removed such that a trench pattern is formed in the bank.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device comprising:
- a substrate divided into a display area and a non-display area;
- a first light-blocking layer and a data line disposed on the substrate in the display area;
- a first buffer layer disposed on the first light-blocking layer and the data line;
- a second light-blocking layer disposed on the first buffer layer;
- a second buffer layer disposed on the second light-blocking layer;
- a semiconductor layer and a drive semiconductor layer disposed on an upper portion of the second buffer layer and made of an oxide semiconductor;
- a gate insulating layer disposed on the semiconductor layer and the drive semiconductor layer;
- a gate electrode disposed on the gate insulating layer;
- a protective layer and a first planarization layer disposed on an upper portion of the gate electrode;
- a drain electrode disposed on an exposed part of the protective layer where a partial area of the first planarization layer is removed;
- a drive drain electrode disposed on an upper portion of the protective layer and an upper portion of the first planarization layer and electrically connected to the drive semiconductor layer;
- a second planarization layer disposed on the drain electrode, the drive drain electrode and the first planarization layer; and
- a light-emitting element disposed on an upper portion of the second planarization layer and comprising an anode, a light-emitting part and a cathode,
- wherein the semiconductor layer is connected to the first light-blocking layer through a first light-blocking layer contact hole, the drain electrode is connected to the semiconductor layer through a drain contact hole, and the first light-blocking layer contact hole and the drain contact hole overlap with each other,
- wherein the drive semiconductor layer is connected to the second light-blocking layer through a second light-blocking layer contact hole, the drive drain electrode is connected to the drive semiconductor layer through a drive drain contact hole, and the second light-blocking layer contact hole and the drive drain contact hole overlap with each other.

2. The electroluminescent display device of claim 1, wherein
- the second light-blocking layer overlaps with the first light-blocking layer.

3. The electroluminescent display device of claim 2, wherein the first light-blocking layer and the second light-blocking layer are made of Ti or a Ti alloy.

4. The electroluminescent display device of claim 1, further comprising:
- a high-potential power line disposed on the substrate.

5. The electroluminescent display device of claim 4, further comprising:
- a drive gate electrode disposed on an upper portion of the drive semiconductor layer,
- wherein the drain electrode is electrically connected to the drive gate electrode through a contact hole.

6. The electroluminescent display device of claim 5, wherein one part of the drive semiconductor layer is electrically connected to the high-potential power line, and another part of the drive semiconductor layer is electrically connected to the second light-blocking layer.

7. The electroluminescent display device of claim 6, wherein the drain electrode and the drive drain electrode are made of Ti or a Ti alloy.

8. The electroluminescent display device of claim 2, further comprising a pad line disposed on the substrate in the non-display area.

9. The electroluminescent display device of claim 8, further comprising a connection electrode disposed on the second buffer layer and electrically connected to the pad line,
- wherein the connection electrode is made of a conductive semiconductor of the oxide semiconductor.

10. The electroluminescent display device of claim 9, further comprising a pad electrode disposed on the protective layer and electrically connected to the connection electrode,
- wherein the pad electrode is disposed on a same layer as the drain electrode and made of a same conductive material as the drain electrode.

11. The electroluminescent display device of claim 2, further comprising:

a bank disposed on the second planarization layer and comprising an opening portion through which a part of the anode is exposed, wherein a partial area of the bank is removed such that a trench pattern is formed in the bank.

* * * * *